United States Patent [19]

Blaha et al.

[11] 4,096,509
[45] Jun. 20, 1978

[54] MNOS MEMORY TRANSISTOR HAVING A REDEPOSITED SILICON NITRIDE GATE DIELECTRIC

[75] Inventors: Franklyn C. Blaha, Glen Burnie; James R. Cricchi, Catonsville, both of Md.

[73] Assignee: The United States of America as represented by the Secretary of the Air Force, Washington, D.C.

[21] Appl. No.: 707,574

[22] Filed: Jul. 22, 1976

[51] Int. Cl.² .................... H01L 29/78; H01L 29/34; H01L 27/02
[52] U.S. Cl. ........................ 357/23; 357/54; 357/6; 357/41; 357/56
[58] Field of Search ............ 357/23, 24, 54, 56, 357/41, 43, 6

[56] References Cited
U.S. PATENT DOCUMENTS

| | | | |
|---|---|---|---|
| 3,696,276 | 10/1972 | Boland | 357/54 |
| 3,719,866 | 3/1973 | Naber et al. | 357/54 |
| 3,728,784 | 4/1973 | Schmidt | 357/54 |
| 3,793,090 | 2/1974 | Barile et al. | 357/54 |
| 3,821,566 | 6/1974 | Cricchi | 357/23 |
| 3,836,894 | 9/1974 | Cricchi | 357/54 |
| 3,845,327 | 10/1974 | Cricchi | 357/23 |
| 3,859,642 | 1/1975 | Mar | 357/54 |
| 3,881,180 | 4/1975 | Gosney | 357/23 |
| 3,925,804 | 12/1975 | Cricchi et al. | 357/54 |
| 3,958,266 | 5/1976 | Athanas | 357/42 |

OTHER PUBLICATIONS

A Double-Diffused MNOS Transistor as a New Non-Volatile Memory; by Endo IEE Meeting; No. 73 CHO781-5ED 1973.
Improvement of the Gate-Region Integrity in FET Devices; by Abbas et al., IBM Technical Disclosure Bulletin, vol. 14, No. 11, Apr. 1972 pp. 3348-3350.

Primary Examiner—Andrew J. James
Attorney, Agent, or Firm—Joseph E. Rusz; Willard R. Matthews, Jr.

[57] ABSTRACT

A processing technique utilizing two separate silicon nitride depositions (one to form the memory regions and the second to form the nonmemory regions) is employed to provide a radiation hard drain source protected memory transistor. The amount of silicon dioxide used in the nonmemory regions is also minimized. A typical device comprises a mesa etched from a silicon-on-sapphire (SOS) wafer into which P+ source and drain regions are implanted. A 100 A layer of silicon dioxide and a second 1000 A layer of nonmemory silicon nitride covers the mesa and the two layers are etched to define a substrate gate window. The gate window is covered by a 25 A layer of tunneling oxide A final 500 A layer of memory silicon nitride covers the mesa structure. Contact windows are etched to accommodate source, drain and gate interconnect electrodes.

3 Claims, 7 Drawing Figures

MNOS MEMORY TRANSISTOR HAVING A REDEPOSITED SILICON NITRIDE GATE DIELECTRIC

STATEMENT OF GOVERNMENT INTEREST

The invention described herein may be manufactured and used by or for the Government for governmental purposes without the payment of any royalty thereon.

BACKGROUND OF THE INVENTION

This invention relates to MNOS memory transistors and in particular to a technique for manufacturing radiation hardened drain source protected memory transistors using a redeposited silicon nitride gate dielectric.

The conventional drain source protected memory transistor has a deposited nitride layer that overlaps thick oxide protected non-memory regions. The thickness of the nitride layer and the charge at the nitride thick oxide interface both affect the threshold of the non-memory region. Since the operating characteristics of the drain source protected memory transistor depend on both memory and non-memory characteristics it is desirable to have independent control of their processing parameters.

The conventional MNOS memory transistor also exhibits positive charge buildup in its silicon dioxide layer when subjected to X-ray irradiation. The charge buildup results in a turn-on voltage shift that substantially degrades the transistor performance.

The present invention is directed toward providing an MNOS memory transistor that is impervious to the effects of any ionizing total dose irradiation and that also allows the threshold and operating characteristics of the non-memory and memory regions to be individually controlled.

SUMMARY OF THE INVENTION

The invention comprehends a processing sequence and a dielectric structure that provides a drain source protected MNOS memory transistor whose non-memory sections are hardened to total dose ionizing x-ray radiation. The process utilizes a silicon dioxide layer in the non-memory regions that is thick enough to prevent charge tunneling on any sort of memory action and thin enough that positive charge build up in the oxide is minimized. The thick oxide region which would normally comprise the non-memory structure in a conventional transistor is replaced by a combination thin 100 A oxide, thick 1000 A non-memory nitride and 500 A memory nitride layers.

It is a principal object of the invention to provide a new and improved MNOS memory transistor.

It is another object of the invention to provide a new and improved method of manufacturing a radiation hardened MNOS memory transistor.

It is another object of the invention to provide an MNOS memory transistor that is impervious to the effects of any inonizing total dose irradiation.

It is another object of the invention to provide a new and improved technique for manufacturing an MNOS memory transistor that allows the threshold and operating characteristics of the non-memory and memory regions to be individually controlled.

It is another object of the invention to provide a new and improved technique for manufacturing an MNOS transistor having the advantages described without increasing photo alignment tolerances or mask sequence complexity.

These, together with other objects, features and advantages will become more readily apparent from the following detailed description when taken in conjunction with the illustrative embodiment in the accompanying drawings.

DETAILED DESCRIPTION OF THE PREFERRED EMBODIMENT

Figure 1:
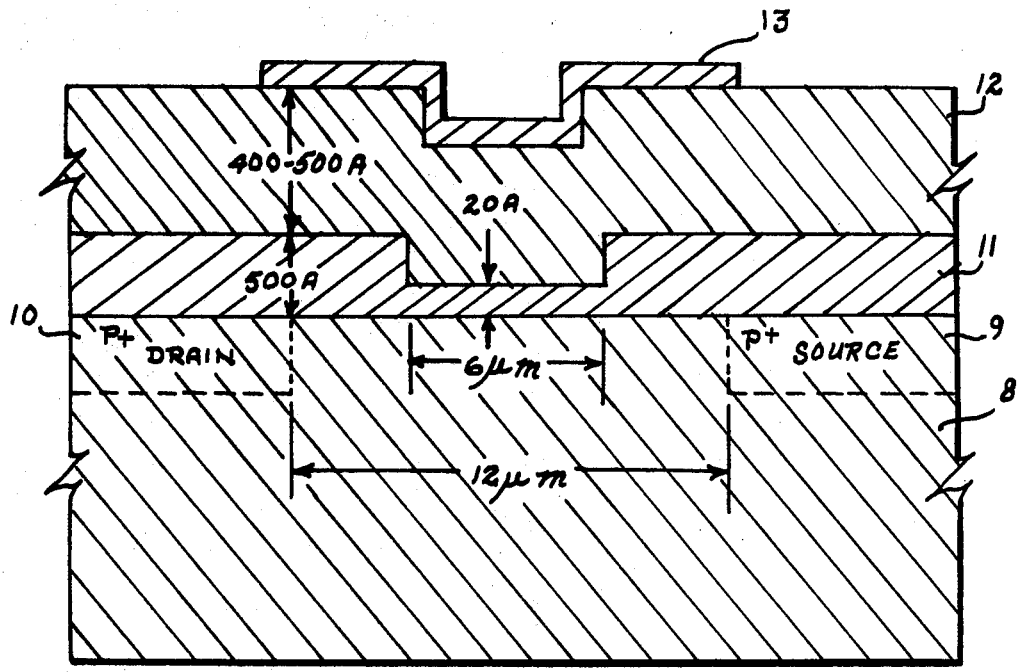
FIG. 1 is a sectional view of a portion of a prior art MNOS memory transistor.

A partial sectional view of a conventional drain source protected MNOS memory transistor is shown in FIG. 1 of the drawings. It comprises an N type silicon mesa 8 deposited on a sapphire substrate (not shown). Drain region 10 and source region 9 are established by P+ implantation. The mesa is covered with a layer 11 of silicon dioxide and a layer 12 ofsilicon nitride. The structure also includes gate electrode 13 and source and drain electrode (not shown).

Figure 2:
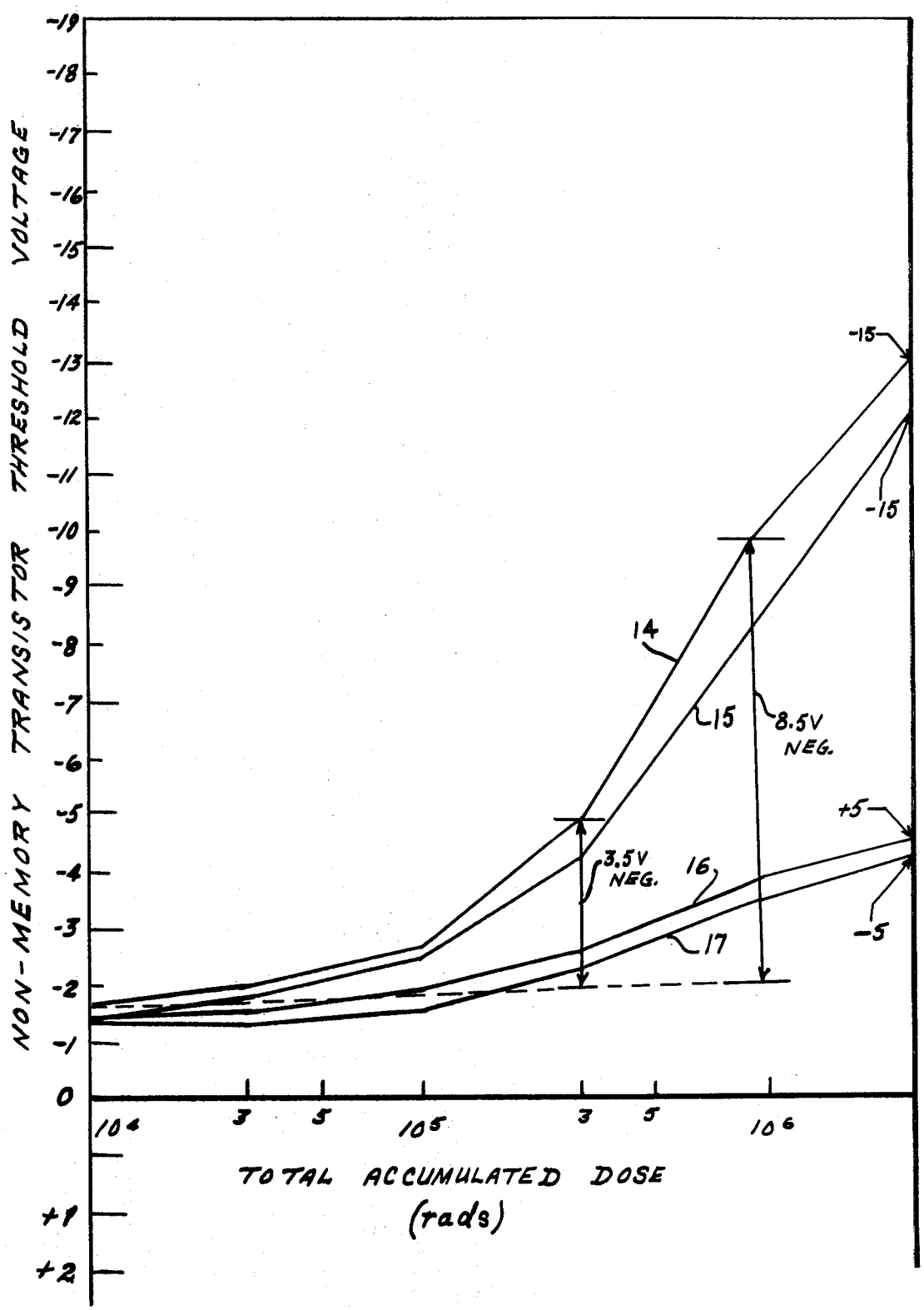
FIG. 2 is a graph showing curves of threshold voltage as a function of total dose for a standard MNOS transistor structure.

The standard drain source protected memory transistor structure as shown in FIG. 1 has a double dielectric structure consisting of thermally grown silicon dioxide layer 11 and deposited silicon nitride layer 12 in the non-memory regions. Under ionizing total dose X-ray irradiation positive charge build up occurs in the oxide part of this structure causing the threshold or turn-on voltage to shift in the negative direction as shown by curves 14–17 in FIG. 2. At relatively low dose levels, the threshold has shifted more the three volts negative for some gate bias conditions. For example, it can be noted from FIG. 2 that the threshold shift at $3 \times 10^5$ rads is 3.5 V negative and the threshold shift at $10^6$ rads is 8.5 volts.

Figure 3:
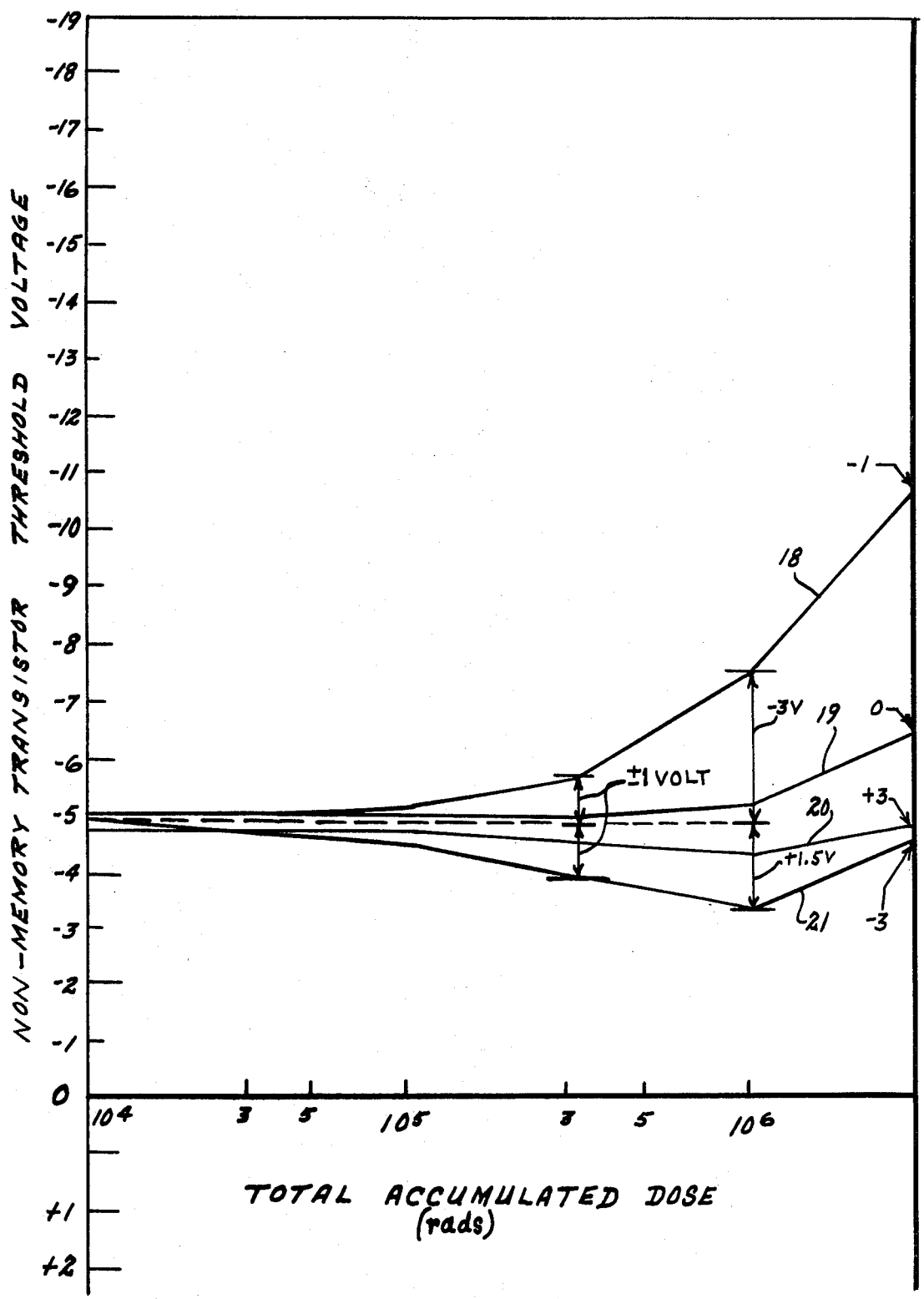
FIG. 3 is a graph showing curves of threshold voltage as a function of total dose for the MNOS transistor of the invention.

To minimize this problem, the NR/NRD (nitride removal followed by nitride reproduction) structure comprehended by the invention is used. In this structure the amount of silicon dioxide in the non-memory regions is minimized and replaced by an equivalent dielectric thickness of silicon nitride. Positive charge buildup does not occur in the nitride layer and the resultant structure is significantly more radiation hard as shown by curves 18–21 in FIG. 3.

Figure 4:
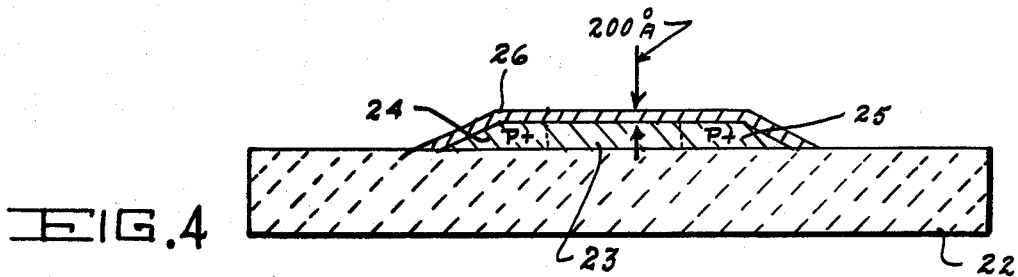
FIG. 4 is sectional view of the MNOS transistor structure of the invention taken after the tenth step of the fabrication process.
Figure 5:
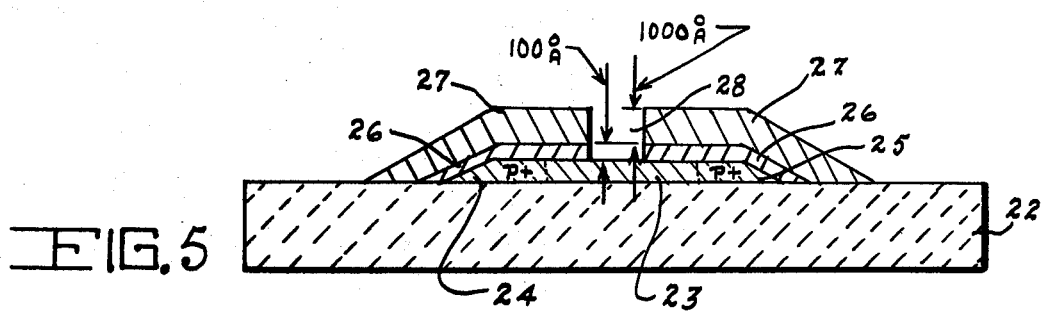
FIG. 5 is a section view of the MNOS transistor structure of the invention taken after the thirteenth step of the fabrication process.
Figure 6:
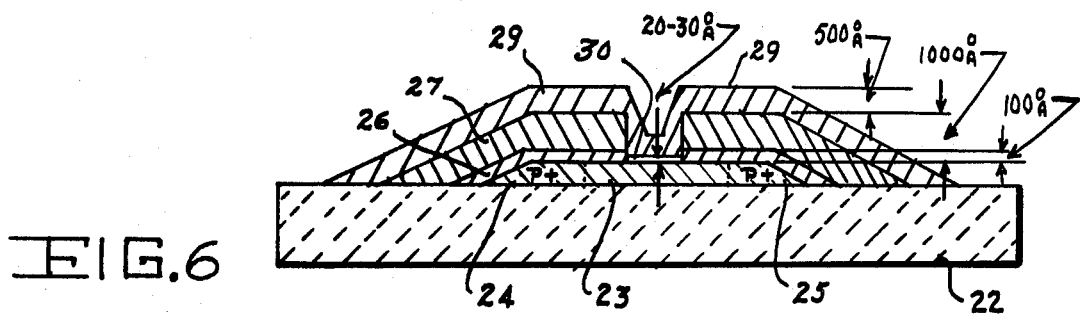
FIG. 6 is a sectional view of the MNOS transistor structure of the invention taken after the fourteenth step of the fabrication process.
Figure 7:
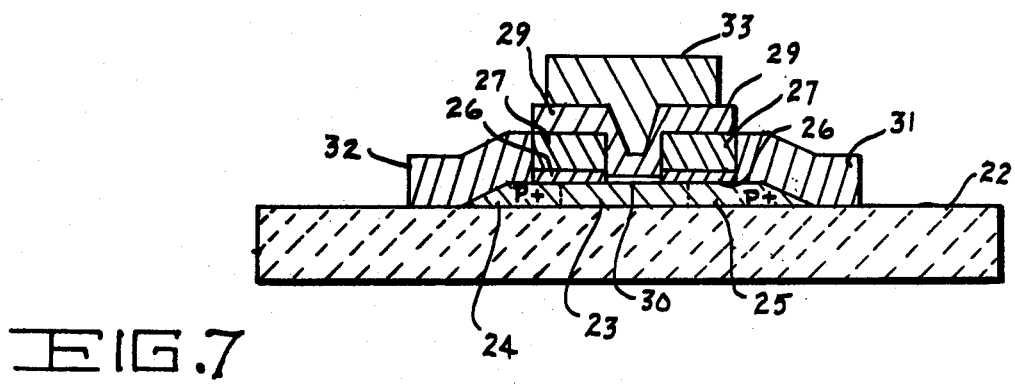
FIG. 7 is a sectional view of the MNOS transistor structure of the invention taken after the twentieth and final step of the fabrication process.

FIGS. 4, 5, 6 and 7 of the drawings are sectional views of the NR/NRD structure following various steps of the fabrication process (steps 10, 13, 14 and 20, respectively) and illustrate the essential elements and procedures of the invention. The transistor is fabricated by etching a mesa of silicon on an SOS wafer. Referring to FIG. 4 the silicon mesa 23 is shown on sapphire substrate 22. A source region 25 and a drain region 24 are established by P+ implantation. A 200 A layer 26 of non-memory silicon dioxide is then grown over the mesa. Subsequently silicon dioxide layer 26 is etched to 100 A and a 1000 A layer 27 of non-memory silicon nitride is deposited over silicon dioxide layer 26. Both layers are then removed from memory section 28 to provide the structure shown in FIG. 5. A 20-30 A layer 30 of tunneling oxide is then grown in memory section 28 and a 500 A layer 29 of memory nitride is deposited over the entire mesa structure as indicated in FIG. 6 Finally, drain source and gate windows are opened and aluminum interconnect electrodes 31, 32 and 33 are deposited and photo-engraved. A sectional view of the completed transistor structure is shown in FIG. 7.

The detailed process sequence for the NR/NRD structure is listed below:

Processing Sequence NR/NRD for SOS Wafers

1. CMOS Clean 7k A Undensified Silox Deposition
2. Photoengrave 6003-1 SI Mask (Define Silicon Islands)
3. Etch Silicon in Hydrazine — Strip Silox
4. CMOS Clean 7k A Silox Deposition Undensified
5. Photoengrave 6003-2 N+ Mask
6. N+ Deposition 5-15-1 950° C 20 ±5 0/ Strip Phosphorous Class, Strip Oxide
7. CMOS Clean, 7k A Silox Deposition Undensified
8. Photoengrave 6003-3 P+ Mask
9. P+ Deposition 3-18-2 980° C 36 ± 50
10. CMOS Clean 900° C Thermal Dry Oxide 200° A 30 min. $N_2$ Anneal
11. Prenitride Clean (Thins Oxide Layer to 100A) Deposit Non-Memory Nitride 1000 A 750° C
12. 2-3k A Silox Deposition
13. Photoengrave 6003-4 MGW Negative Resist (Define Memory Regions)
    Etch Silox
    Strip Resist
    Etch Nitride
    Etch 200 A Oxide
    Strip Remaining Silox
14. Prenitride Clean
    Memory Nitride Deposition: 500 ± 50 A 750° C
15. 12k A Undensified Silox
16. Photoengrave 6003-5 CW (Define Contact Windows)
    Etch 12kA Silox Strip Resist
    Etch 1500 A Nitride (Chem Etch)
    Etch 100 A Oxide
17. Photoengrave 6003-6 GW (Define Gate Windows)
    Etch 12k A Silox
18. Aluminum Deposition Cold 7k A A1-Cu
    Electron Beam Sinter 400° C 25 minutes
19. Photoengrave 6003-8M1 (Define Aluminum Interconnect)
20. Sinter 500° C 25 minutes While the invention has been described in terms of one presently preferred embodiment, it is understood that the words which have been used are words of description rather than words of limitation and that changes within the purview of the appended claims may be made without departing from the scope and spirit of the invention in its broader aspects.

What is claimed is:

1. A radiation hardened MNOS memory transistor comprising
    a substrate of electrically insulating material,
    a mesa of semiconductor material deposited on the surface thereof,
    a source region formed by P+ diffusions into a portion of said mesa adjacent one edge thereof,
    a drain region formed by P+ diffusions into a portion of said mesa adjacent the edge thereof opposite said source region, said source and drain regions in part defining a substrate gate region therebetween,
    a layer of silicon dioxide covering said substrate gate region and portions of said source and drain regions, a portion of said silicon dioxide layer in the vicinity of said substrate gate region being removed to define a gate window,
    a layer of tunneling oxide covering said gate window,
    a layer of non-memory silicon nitride covering said silicon dioxide layer,
    a layer of memory silicon nitride covering said non-memory silicon nitride layer and said tunneling oxide layer,
    a source electrode,
    a drain electrode, and
    a gate electrode.

2. A radiation hardened MNOS memory transistor as defined in claim 1 wherein said substrate of electrically insulating material consists of sapphire and said mesa of semiconductor material consists of N type silicon.

3. A radiation hardened MNOS memory transistor as defined in claim 2 wherein said layer of silicon dioxide is substantially 100 A thick, said layer of non-memory silicon nitride is substantially 1000 A thick, said layer of tunneling oxide is substantially 25 A thick and said layer of memory silicon nitride is substantially 500 A thick.

* * * * *